United States Patent

Numata et al.

[11] 4,096,382
[45] Jun. 20, 1978

[54] PHOTO-CURRENT LOG-COMPRESSION CIRCUIT

[75] Inventors: Saburo Numata; Shinichiro Okazaki, both of Urawa, Japan

[73] Assignee: Fuji Photo Optical Co., Ltd., Omiya, Japan

[21] Appl. No.: 767,073

[22] Filed: Feb. 9, 1977

[30] Foreign Application Priority Data

Feb. 9, 1976 Japan .............................. 51-13748[U]

[51] Int. Cl.$^2$ ............................................ H01J 39/12
[52] U.S. Cl. ............................ 250/214 A; 250/214 C; 250/214 L; 307/310; 307/311; 328/2
[58] Field of Search ........ 250/214 A, 214 AL, 214 C, 250/214 L, 214 P; 307/230, 310, 311; 328/2, 145

[56] References Cited

U.S. PATENT DOCUMENTS

| | | | |
|---|---|---|---|
| 3,525,942 | 8/1970 | Boronkay et al. | 307/311 X |
| 3,676,686 | 7/1972 | Allington | 307/311 X |
| 3,992,622 | 11/1976 | Numata et al. | 307/311 X |
| 4,015,149 | 3/1977 | Tsunekawa et al. | 307/311 X |
| 4,038,555 | 7/1977 | Freeman | 250/214 L X |

Primary Examiner—James B. Mullins

[57] ABSTRACT

A photoelectric current log-compression circuit includes a log-conversion diode, a photodiode and an operational amplifier for log-compression. In the negative feedback circuit of the operational amplifier is inserted a thermistor to control the amplification degree of the operational amplifier according to the current flowing through the log-conversion diode. Further, a forward voltage of a temperature compensating diode biased with a constant current is applied to the reference voltage of the operational amplifier.

3 Claims, 3 Drawing Figures

PHOTO-CURRENT LOG-COMPRESSION CIRCUIT

BACKGROUND OF THE INVENTION

1. Field of the Invention

This invention relates to a photoelectric current log-compression circuit, and more particularly to an improvement in a circuit for log-compressing a photoelectric current. The present invention is particularly concerned with a temperature compensating means in a photoelectric current log-compression circuit.

2. Description of the Prior Art

It has been known in the art to use a diode for log-compressing a photoelectric current utilizing the logarithmic relationship between the forward current and the forward voltage of the diode. The current-voltage relationship of the diode is changed as the temperature changes. The rate of change of the current-voltage relation accompanying the change in temperature, however, changes as the forward current flowing through the diode changes. Therefore, in the log-compression circuit using a diode the degree of the temperature compensation should be changed as the forward current flowing through the diode changes.

In order to effect the above result, it has been known in the prior art to compensate the log-compressed output for the temperature influence on the log-conversion diode by means of the forward voltage of the diode and compensate the same for the variation in the forward current flowing through the diode by means of a thermistor or the like.

The above described conventional circuit is disadvantageous in that at least two operational amplifiers are necessitated and accordingly the structure thereof becomes complicated.

SUMMARY OF THE INVENTION

In view of the above defect inherent in the prior art, the primary object of the present invention is to provide a photocurrent log-compression circuit with compensation means which is simple in structure and of high performance.

Another object of the present invention is to provide a photocurrent log-compression circuit which can be manufactured at a low cost.

A specific object of the present invention is to provide a photocurrent log-compression circuit in which an operational amplifier used for log-compression is caused to have an amplifying function and the amplification degree thereof is changed according to temperature.

The above objects are accomplished by providing a photocurrent log-compression circuit comprising a log-conversion diode, a photodiode and an operational amplifier wherein a temperature compensating element which changes its resistance as the temperature changes is inserted in a negative feedback circuit of the operational amplifier and a forward voltage of a diode biased with a predetermined current is added to or subtracted from the reference voltage of the operational amplifier.

DESCRIPTION OF THE PREFERRED EMBODIMENTS

Figure 1:
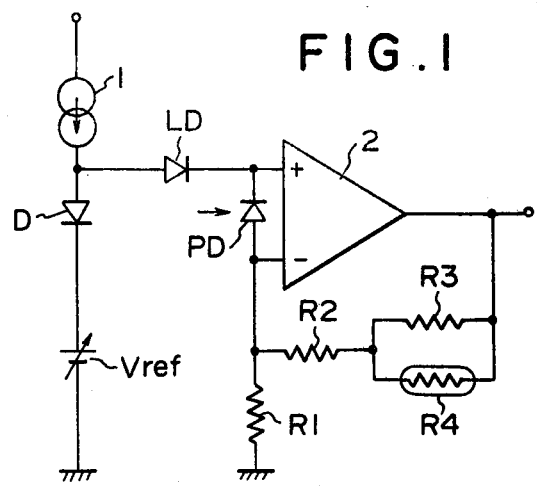
FIG. 1 is a diagram showing an embodiment of the circuit in accordance with the present invention.

Referring to FIG. 1 which shows a preferred embodiment of the present invention, a constant current source 1 including for instance a constant current diode or transistor is connected with the anode of a temperature compensating diode D the cathode of which is grounded by way of a reference voltage Vref. The temperature compensating diode D is biased with the constant current from the constant current source 1. Thus, a reference voltage circuit is constituted.

A connecting point between the constant current source 1 and the temperature compensating diode D is connected to an anode of a log conversion diode LD. The cathode of the log conversion diode LD is connected to the non-inversion input terminal (+) of an operational amplifier 2. Between the non-inversion input terminal (+) and the inversion input terminal (−) is connected a photodetector PD like a photodiode. The input impedance of the operational amplifier 2 is extremely high with respect to the current flowing through the photodetector PD. The operational amplifier 2 has, therefore, for instance a MOS (metal oxide semiconductor) type FET (field effect transistor) in the first step thereof.

The output of the operational amplifier 2 is negative fed back to the inversion input terminal (−) thereof by way of a parallel circuit of resistors $R_3$ and $R_4$ and another resistor $R_2$ connected in series therewith. The inversion input terminal (−) of the operational amplifier 2 is grounded by way of a resistor $R_1$.

Now the operation of the above described embodiment of the present invention will be described with reference to FIG. 1.

The current flowing through the temperature compensating diode D is determined by the constant current source 1. Therefore, the current put into the log conversion diode LD is determined by the constant current source 1 and the temperature coefficient of the temperature compensating diode D.

Through the log conversion diode LD flows a current of about $10^{-12}$ to $10^{-5}$ A corresponding to the scene brightness measured by the photodiode PD. The temperature coefficient of the log conversion diode LD changes as the forward current flowing through the log conversion diode LD changes. Therefore, said temperature compensation by means of the temperature compensating diode D is still insufficient.

In order to completely compensate for the temperature, a temperature compensating element such as a thermistor $R_4$ is inserted into the negative feedback circuit of the operational amplifier 2 which controls the amplification degree thereof. The temperature compensating element such as a thermistor R4 changes its resistance according to the ambient temperature. The temperature compensating element such as a thermistor $R_4$ effects to compensate the amplification degree of the operational amplifier 2 for the temperature change.

The operational amplifier 2 is of the type of voltage follower of a non-inversion output in the above embodiment.

Figure 2:
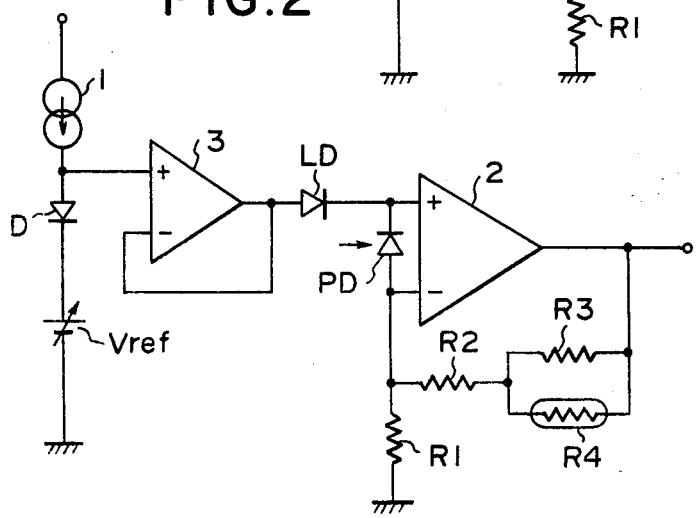
FIG. 2 is a diagram showing another embodiment of the circuit in accordance with the present invention in which a buffer is employed.

In the above described embodiment of the invention as shown in FIG. 1, the current flowing through the temperature compensating diode D is reduced when the scene brightness becomes high since a part of the constant current supplied to the diode D flows through the photodetector PD by way of the log conversion diode LD. Therefore, it is desirable that a buffer of a voltage follower 3 should be inserted as shown in FIG. 2. The voltage follower 3 the inserted between the log conversion diode LD and the connecting point between the constant current source 1 and the temperature compensating diode D. With this buffer 3, there is no fear of reduction of the current flowing through the temperature compensating diode D.

Figure 3:
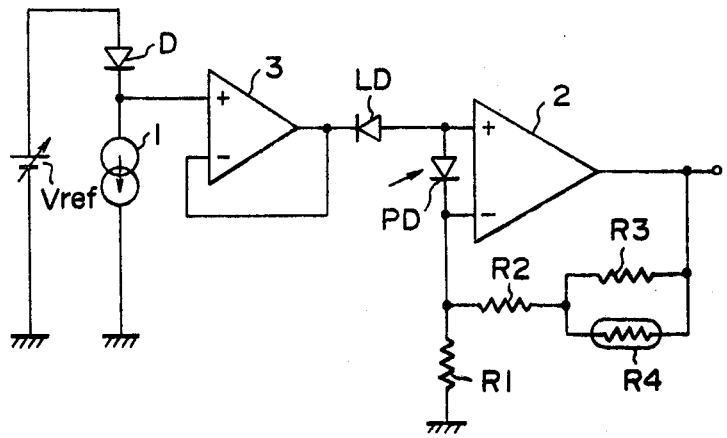
FIG. 3 is a diagram showing still another embodiment of the circuit in accordance with the present invention.

A still another embodiment of the present invention is shown in FIG. 3 in which the direction of the photodetector PD and the log conversion diode LD is reversed in the circuit of FIG. 2. In this embodiment, the non-inversion input terminal (+) of the voltage follower 3 is supplied with a voltage which corresponds to the difference between the reference voltage Vref and the voltage drop caused by the temperature compensating diode D. Thereore, in this embodiment, as shown in FIG. 3, the non-inversion input terminal (+) of the voltage follower 3 is connected with the cathode of the temperature compensating diode D the anode of which is grounded by way of the reference voltage Vref and is further connected with the constant current source 1 which is grounded.

Throughout FIGS. 1 to 3, all the elements equivalent to each other are indicated with the same reference numerals.

We claim:

1. A photoelectric current log-compression circuit comprising: a reference voltage source and a constant current source, an operational amplifier, a log-conversion diode connected to a non-inversion input terminal of said operational amplifier, a photodetector connected between the non-inversion input terminal and an inversion input terminal of the operational amplifier, a temperature compensating element which changes the resistance thereof inserted in a negative feedback circuit of the operational amplifier to control the amplification degree, and a temperature compensating diode connected between said sources and biased with a predetermined current therefrom, said log-conversion diode being connected between the operational amplifier and a connecting point between said constant current source and said temperature compensating diode whereby a forward voltage of the temperature compensating diode is applied to the operational amplifier.

2. A photoelectric current log-compression circuit as defined in claim 1 wherein said temperature compensating element is a thermistor.

3. A photoelectric current log-compression circuit as defined in claim 1 wherein a buffer is connected between the log-conversion diode and said connecting point.

* * * * *